US006280652B1

(12) United States Patent
Inoue et al.

(10) Patent No.: US 6,280,652 B1
(45) Date of Patent: Aug. 28, 2001

(54) EDGE POLISHING COMPOSITION

(75) Inventors: Yutaka Inoue; Akihiro Kawase, both of Aichi (JP)

(73) Assignee: Fujimi Incorporated, Nishikasugai-gun (JP)

( * ) Notice: Subject to any disclaimer, the term of this patent is extended or adjusted under 35 U.S.C. 154(b) by 0 days.

(21) Appl. No.: 09/323,827

(22) Filed: Jun. 2, 1999

(30) Foreign Application Priority Data

Jun. 5, 1998 (JP) .................................................. 10-156988

(51) Int. Cl.⁷ ..................................................... C09K 13/00
(52) U.S. Cl. ......................... 252/79.1; 252/79.5; 438/692; 438/693
(58) Field of Search .................................. 252/79.1, 79.5; 51/307, 308, 309

(56) References Cited

U.S. PATENT DOCUMENTS

| 4,057,939 | * | 11/1977 | Basi ........................................ 51/281 |
| 4,169,337 | * | 10/1979 | Payne ...................................... 51/283 |
| 4,588,421 | * | 5/1986 | Payne ...................................... 51/308 |
| 5,426,073 | * | 6/1995 | Imaoka et al. ....................... 437/225 |
| 6,099,604 | * | 8/2000 | Sandu et al. .......................... 51/307 |

FOREIGN PATENT DOCUMENTS

| 0 846 740 | | 6/1998 | (EP) . |
| 0846740 | * | 6/1998 | (EP) ................................ C09G/1/02 |

OTHER PUBLICATIONS

Patent Abstracts of Japan, vol. 017, No. 148 (E–1338), Mar. 1993.*

* cited by examiner

Primary Examiner—Benjamin L. Utech
Assistant Examiner—Charlotte A. Brown
(74) Attorney, Agent, or Firm—Oblon, Spivak, McClelland, Maier & Neustadt, P.C.

(57) ABSTRACT

An edge polishing composition for wafers, comprising water and silicon dioxide having an average particle size of from 70 to 2,500 nm.

5 Claims, No Drawings

EDGE POLISHING COMPOSITION

The present invention relates to a polishing composition suitable for processing the edge surface of semiconductor wafers. More particularly, the present invention relates to an edge polishing composition which provides a high polishing removal rate in the edge surface processing (hereinafter referred to as "edge polishing") of silicon wafers or semiconductor wafers having an oxide film formed thereon and which is capable of reducing deposition of a dried gel on the wafer surface and at the same time capable of forming an excellent wafer edge surface (hereinafter referred to as "an edge").

In recent years, high performance semiconductor device chips to be used for high technology products including computers, have been developed for high integration and high capacity, and enlargement of the chip sizes due to high capacity is in progress. Further, in the design rule for semiconductor devices, miniaturization has progressed year after year, and the focal depth in the process for producing devices tends to be shallow, whereby the requirement for precision of the processed surface required for a wafer prior to forming a device has been increasingly strict.

On the other hand, due to the enlargement of chip sizes, decrease in the productivity, increase of production costs and other problems have resulted. To solve such problems, it has been attempted to enlarge the area of a semiconductor wafer from which device chips are produced, thereby to increase the number of chips per unit area, i.e. to enlarge the size of a wafer.

As parameters for the precision of the processed surface, various surface defects may be mentioned, such as deposition of relatively large foreign matters, LPD (Light Point Defects, which will be described hereinafter), scratches, surface roughness, haze levels, SSS (Sub-Surface Scratches, a type of fine scratches which are called also as latent scratches) and other defects.

The relatively large foreign matters which deposit on wafers, may be those attributable to a dry gel formed by drying of a polishing composition, etc. LPD includes defects attributable to fine foreign matters (hereinafter referred to as "particles") deposited on the surface of a wafer and defects attributable to COP (Crystal Originated Particles).

If such relatively large foreign matters or LPD exists, there will be pattern defects, break down voltage of an insulator, failure in injection of ions or deterioration of other device properties, in the subsequent device-forming step, thus causing a decrease in the yield. Therefore, a study has been made for wafers substantially free from such surface defects or a method for producing such wafers.

A silicon wafer as a typical semiconductor substrate, is prepared by slicing a silicon single crystal ingot to obtain a wafer, which is subjected to rough polishing so-called lapping to shape the contour. Then, the damaged layer formed on the wafer surface by slicing or lapping, is removed by etching. Thereafter, especially in the case of a silicon semiconductor wafer having a large diameter of at least 8 inches, edge polishing is usually applied for the purpose of preventing cracking or chipping of the edge, as described hereinafter, or for the purpose of preventing occurrence of particles. It is common that thereafter, primary polishing so-called stock removal polishing, secondary polishing and final polishing are carried out to polish the wafer surface to a mirror surface, to obtain the final product as a silicon wafer. Depending upon the process, the secondary polishing may be omitted, or an additional polishing step may be added between the secondary polishing and the final polishing.

It is common that when a wafer is taken out of a semiconductor production apparatus and transferred, it is transferred as accommodated in a casing. In the case of a conventional wafer having a relatively small area, for example, with a diameter of up to 6 inches, the weight of the wafer itself is small, and even when the edge may rub against the casing, the impact is small, and cracking or chipping of the edge rarely takes place by such rubbing. However, if the diameter of the wafer becomes at least 8 inches, the weight of the wafer itself becomes large, and the impact of rubbing of the edge against the casing tends to be large, so that cracking or chipping is likely to take place at the edge.

Further, with a wafer not subjected to edge polishing, the edge is not smooth, and there has been a problem that when the edge rubs against the casing or when the edge rubs against an arm or the like of the apparatus during handling in between semiconductor production apparatus, cracking or chipping of the edge as well as abrasion of the casing or the arm or the like, is likely to occur, whereby the material of the wafer itself or wearing down the casing, the arm or the like, are likely to deposit on the wafer surface, thus leading to particle defects.

With respect to such a problem, it has been known that by smoothing edge, it is possible to increase the strength of the edge and to reduce the formation of particles, and it has become common to carry out edge polishing to polish and smooth the edge of a wafer after etching.

Heretofore, in such edge polishing, it has been common to employ an edge polishing composition comprising water and colloidal silica having an average particle size of from 10 to 50 nm, or a primary polishing composition which further contains a basic compound. However, edge polishing by means of such a composition has had a problem that the polishing removal rate is low, and the productivity is poor.

Further, during the processing, the scattered composition is likely to dry on the wafer surface, and silica in the composition may deposit thereon as a dry gel. This dry gel cannot be removed by a cleaning step and thus used to be a factor for causing surface defects. Further, if the dry gel deposited on the wafer surface is subjected to primary polishing in a state not adequately removed in the cleaning step, the dry gel may come off during the polishing to form scratches on the wafer surface. Accordingly, an edge polishing composition has been desired which has a high polishing removal rate and whereby no dry gel will deposit.

On the other hand, the demand for epitaxial wafers is increasing year after year, which are useful for discrete semiconductors, bipolar IC, MOSIC, etc. Such an epitaxial wafer is a wafer having a thin film of a silicon single crystal (hereinafter referred to as "an epitaxial layer") free from crystal defects grown on the surface of a low resistance wafer containing antimony, arsenic, boron and other dopant in an amount larger than a usual wafer.

In the process for producing such an epitaxial wafer, it may happen that when the epitaxial layer is grown, the dopant contained in the wafer is withdrawn from the back side of the wafer and again taken into the epitaxial layer on the wafer surface, whereby it becomes impossible to obtain a wafer having a prescribed resistance. In order to prevent the dopant from being withdrawn from the back side of the wafer, it has been common to use a semiconductor wafer provided with an oxide film, which is prepared by forming an oxide film on the back side of the wafer after etching, by a chemical or physical method.

Also to such a wafer provided with an oxide film, edge polishing is carried out for the purpose of preventing cracking or chipping of the edge or formation of particles and preventing formation of a crown along the periphery of the wafer. Formation of a crown is a phenomenon in which a silicon single crystal film swells along the periphery of the wafer during the growth of an epitaxial layer, and will be thicker than the center portion of the wafer surface.

Heretofore, as an edge polishing composition for a wafer provided with an oxide film, it has been common to employ an edge polishing composition comprising water and colloidal silica having an average particle size of from 10 to 50 nm, or a primary polishing composition which further contains a basic compound, like in the case of the above-mentioned silicon wafer. Such a composition has also had a problem that the polishing removal rate is very low, it takes a long time for processing, and a dry gel is likely to deposit on the wafer surface.

The present invention has been made to solve the above problems, and it is an object of the present invention to provide an edge polishing composition which has a high polishing removal rate and capable of reducing deposition of a dry gel on the wafer surface and which, at the same time, is capable of forming an excellent edge.

The present invention provides an edge polishing composition for wafers, comprising water and silicon dioxide having an average particle size of from 70 to 2,500 nm.

The edge polishing composition of the present invention presents a high polishing removal rate and is capable of reducing deposition of a dry gel on the wafer surface, in edge polishing of silicon wafers or semiconductor wafers provided with oxide films.

Now, the present invention will be described in detail with reference to the preferred embodiments.

Abrasive

Among the components for the edge polishing composition of the present invention, an abrasive used as the main abrasive, is silicon dioxide. The silicon dioxide includes many types which are different in the properties or in the processes for their production. Among them, silicon dioxide which can be used for the edge polishing composition of the present invention, is preferably amorphous silicon dioxide such as colloidal silica, fumed silica or precipitated silica. Particularly for edge polishing of a semiconductor wafer provided with an oxide film, fumed silica is preferred.

Among them, colloidal silica is produced usually by particle growth of ultra-fine colloidal silica obtained by ion exchange of sodium silicate, or by hydrolysis of an alkoxysilane with an acid or alkali. Colloidal silica produced by such a wet method, is usually obtained in the form of a slurry as dispersed in water in the state of primary particles or secondary particles. Such colloidal silica is commercially available, for example, under a tradename of SPHERICA SLURRY from Catalysts & Chemicals Ind. Co., Ltd.

Fumed silica is one produced by combustion of silicon tetrachloride and hydrogen. Such fumed silica produced by a gas phase method is in the form of secondary particles having a chain structure wherein a few or a few tens primary particles get together and has a characteristic that the content of metal impurities is relatively small. Such fumed silica is commercially available, for example, under a tradename of Aerosil from Nippon Aerosil Co., Ltd.

Precipitated silica is water-containing amorphous silicon dioxide produced by reacting sodium silicate with an acid. Such precipitated silica produced by a wet system is in the form of bulky particles having spherical primary particles agglomerated like grapes and has a characteristic that the specific surface area and the pore volume are relatively large. Such precipitated silica is commercially available, for example, under a tradename of Carplex from Shionogi & Co.

Silicon dioxide polishes the surface to be polished by a mechanical action as abrasive grains. Its average particle size is from 70 to 2,500 nm as an average particle size obtained from the values measured by a light scattering method. Particularly, in the case of colloidal silica, the average particle size is usually from 70 to 1,000 nm, preferably from 120 to 800 nm, more preferably from 150 to 500 nm. In the case of fumed silica, the average particle size is usually from 70 to 300 nm, preferably from 130 to 300 nm, more preferably from 170 to 300 nm. In the case of precipitated silica, the average particle size is usually from 300 to 3,000 nm, preferably from 350 to 2,500 nm, more preferably from 400 to 2,000 nm. The average particle sizes disclosed in this specification are all average secondary particle sizes obtained from the values measured by a light scattering method.

With the edge polishing composition of the present invention, if the average particle size of silicon dioxide exceeds the above-mentioned range, dispersion of the grain particles tends to be hardly maintained, whereby there will be problems such that the stability deteriorates, abrasive grains tend to precipitate, and scratches are likely to form at the polished edge. On the other hand, if it is smaller than the above range, the polishing removal rate tends to be extremely low, and it will take a long time for processing, and deposition of a dry gel is likely to take place on the wafer surface, such being not practical.

The content of the abrasive in the edge polishing composition is usually from 0.005 to 50 wt %, preferably from 0.01 to 30 wt %, more preferably from 0.05 to 10 wt %, based on the total amount of the composition. If the content of the abrasive is too small, the polishing removal rate tends to be low, it takes a long time in processing, or deposition of a dry gel is likely to take place on the wafer surface. On the other hand, if it is too much, the dispersed state of the composition tends to be hardly maintained to be uniform, or the viscosity of the composition tends to be excessive, whereby handling tends to be difficult.

The edge polishing composition of the present invention contains silicon dioxide as an abrasive, but may further contain an abrasive other than silicon dioxide, such as aluminum oxide, cerium oxide, titanium oxide, silicon nitride, zirconium oxide, manganese dioxide, etc., within a range not to impair the effects of the present invention.

Other additives

The edge polishing composition of the present invention comprises the above-mentioned abrasive and water, but may further contain other additives, as the case requires.

As such an additive, a basic compound may, for example, be mentioned. The polishing composition composed solely of an abrasive and water, polishes the surface to be polished by a mechanical action. Whereas, such a basic compound is considered to supplement the mechanical polishing action by a chemical action. Accordingly, when the edge polishing composition of the present invention contains a basic compound, the basic compound should be selected so that it is soluble in the composition i.e. a water-soluble basic compound.

The basic compound to be used in the present invention is not particularly limited so long as it does not impair the effects of the present invention. However, it is preferably at least one compound selected from the group consisting of methylamine, dimethylamine, trimethylamine, ethylamine, diethylamine, triethylamine, ethylenediamine, hexamethylenediamine, piperazine hexahydrate, anhydrous piperazine, 1-(2-aminoethyl)piperazine, N-methylpiperazine, diethylenetriamine, monoethanolamine, diethanolamine, triethanolamine, N-methylethanolamine, N-methyl-N,N-diethanolamine, N,N-dimethylethanolamine, N,N-diethylethanolamine, N,N-dibutylethanolamine, N-(β-aminoethyl)ethanolamine, monoisopropanolamine, diisopropanolamine, triisopropanolamine, ammonium hydroxide, tetramethylammonium hydroxide, ammonium carbonate, ammonium hydrogencarbonate, potassium hydroxide and sodium hydroxide. These basic compounds may be used in combination in an optional ratio.

Further, particularly when used for edge polishing of a semiconductor wafer provided with an oxide film, the edge polishing composition of the present invention preferably contains at least one compound selected from the group consisting of ammonium hydroxide, tetramethylammonium hydroxide, ammonium carbonate, ammonium hydrogencarbonate, potassium hydroxide and sodium hydroxide.

When the edge polishing composition of the present invention contains a basic compound, the content of the basic compound is preferably from 0.001 to 30 wt %, more preferably from 0.005 to 10 wt %, particularly preferably from 0.01 to 5 wt %, based on the total amount of the composition, although it varies depending upon the type of the basic compound used. As the content of the basic compound increases, deposition of a dry gel on the wafer surface tends to decrease. However, if the content is excessively large, the chemical action will be too strong, and there will be drawbacks such that a surface defect such as surface roughening is likely to form on the wafer surface by the strong etching action, or the stability of abrasive grains as the abrasive is likely to be lost, whereby precipitates may form. On the other hand, if a proper amount of the basic compound is contained, the polishing removal rate will be improved by a chemical action, as mentioned above, and an effect will also be obtained such that deposition of a dry gel on the wafer surface will be reduced. Particularly when fumed silica is used as the abrasive, the addition of the basic compound brings about merits such as prevention of gelation of the composition, improvement in the dispersion stability and reduction of the viscosity.

To the edge polishing composition of the present invention, in addition to the above-mentioned basic compound, various additives may further be incorporated for the purpose of stabilizing or maintaining the quality of the product or depending upon the type of the object to be polished, the polishing condition and other necessity for polish processing. As such further additives, the following may be mentioned.

(a) Celluloses such as cellulose, carboxymethylcellulose, hydroxyethylcellulose, etc.

(b) Water-soluble alcohols such as ethanol, propanol, ethylene glycol, etc.

(c) Surfactants such as sodium alkylbenzenesulfonate, a condensate of naphthalenesulfonic acid with formalin, etc.

(d) Organic polyanionic substances such as lignin sulfonate, a polyacrylate, etc.

(e) Water-soluble polymers (emulsifiers) such as polyvinyl alcohol, etc.

(f) Chelating agents such as dimethylglyoxime, dithizone, oxine, acetylacetone, glycine, EDTA, NTA, etc.

(g) Fungicides such as sodium alginate, etc.

Further, to the edge polishing composition of the present invention, another one among those including the above-mentioned abrasives and additives, may be used as a further additive for the purpose other than use as an abrasive or abrasive accelerator, e.g. for preventing precipitation of the abrasive.

The polishing composition of the present invention is prepared usually by mixing and dispersing the above abrasive in a desired content in water and dissolving other additives as the case requires in a required amount. The method for dispersing or dissolving these components in water is optional. For example, they may be dispersed by stirring by means of a vane type stirrer or by ultrasonic dispersion. Further, in a case where an additive other than the abrasive material is used, the mixing order of these respective components is optional, i.e. either the dispersion of the abrasive or dissolution of other additive may be carried out first, or both may simultaneously be carried out.

The polishing composition of the present invention can be prepared, stored or transported in the form of a stock liquid having a relatively high concentration, and can be used as diluted at the time of actual polishing operation. The above-mentioned preferred range of concentration is one for the actual polishing operation, and when such a method of use is adopted, needless to say, during the storage or transportation, the composition will be a solution having a higher concentration. Further, from the viewpoint of handling efficiency, the composition is preferably produced in such a concentrated form. The above-mentioned concentration with respect to the polishing composition, is not the concentration of such a concentrated formulation, but it is the concentration at the time of practical use.

The reason as to why the edge polishing composition of the present invention provides a high polishing removal rate and less deposition of a dry gel on the wafer surface, in edge polishing of a silicon wafer or a semiconductor wafer provided with an oxide film, is not clearly understood, but it may be explained as follows, taking a silicon wafer as an example.

Usually, the average particle size of the abrasive in a polishing composition used for primary polishing of the wafer surface, is from 10 to 50 nm. Even if the particle size of this abrasive is increased, the polishing removal rate will not be increased as expected, and other problems such as scratches are likely to result. Accordingly, with a polishing composition for primary polishing, there was no merit in increasing the particle size of the abrasive. Whereas, in edge polishing, if the particle size of the abrasive is increased, the polishing removal rate is remarkably increased. This is considered attributable to the fact that the action of the abrasive is different between flat surface polishing like primary polishing and edge polishing where polishing is carried out along an edge which is very narrow like a dot or a line.

Further, the reason as to why a dry gel is scarcely deposited on the wafer surface, may be such that with the edge polishing composition of the present invention, abrasive particles are large, whereby the surface activity of particles is small, and the adhesive force between the abrasive and the wafer is weak, whereby the composition can readily be removed from the wafer surface, and the processing time can be shortened as the polishing removal rate is high, whereby the composition deposited on the wafer surface during processing will be hardly dried.

Now, the edge polishing composition of the present invention will be described in further detail with reference to Examples. However, it should be understood that the present invention is by no means restricted to such specific Examples.

Edge polishing compositions and their preparation

As an abrasive, colloidal silica (manufactured by Catalysts & Chemicals Ind. Co., Ltd.), fumed silica (manufactured by Nippon Aerosil Co., Ltd.) or precipitated silica (manufactured by Shionogi & Co.) was dispersed in water by means of a stirrer to obtain a slurry having an abrasive concentration of from 2 to 4 wt %. Then, to the slurry, a basic compound as identified in Table 1 or 2 was added in the amount likewise identified, to obtain an edge polishing composition. Using such an edge polishing composition, a test by means of a 8-inch silicon wafer P<100> (subjected to etching treatment) as an object to be polished (Table 1) and a test by means of a 8-inch silicon wafer P<100> provided with an oxide film as an object to be polished (Table 2) were carried out.

Edge polishing test

The conditions for the edge polishing test were as follows.

Polishing machine: Edge polishing machine EP-200 IV SN (manufactured by Speedfam Co., Ltd.)

Load: 2 kg

Drum rotation speed: 800 rpm

Polishing pad: SUBA400 (manufactured by Rodel, Inc. U.S.A.)

Amount of the composition supplied: 300 cc/min (recycled)

Polishing time: 10 minutes

After polishing, the wafer was sequentially washed and dried, and then, the wafer surface was visually inspected by irradiating a spot light in a dark room, to evaluate the deposited state of a dry gel. The evaluation standards were as follows.

⊚: No deposition of a dry gel was observed.

○: No substantial deposition of a dry gel was observed, and the deposition was at a non-problematic level.

X: Deposition of a dry gel was observed at a problematic level.

Then, as an index for the polishing removal rate, the weight reduction of the wafer due to polishing was measured in every test.

The obtained results were as shown in the following Tables.

TABLE 1

Polishing test employing 8-inch silicon wafer P<100> (subjected to etching treatment)

| | Silicon dioxide | Average particle size (nm) | Abrasive concentration (wt %) | Basic compound Type | Basic compound Amount (wt %) | Weight reduction (mg) | Dry gel |
|---|---|---|---|---|---|---|---|
| Example 1 | CS | 80 | 4 | PIZ | 0.2 | 7.8 | ○ |
| Example 2 | CS | 120 | 4 | PIZ | 0.2 | 10.2 | ⊚ |
| Example 3 | CS | 300 | 4 | — | — | 10.0 | ○ |
| Example 4 | CS | 300 | 2 | PIZ | 0.2 | 10.3 | ⊚ |
| Example 5 | CS | 300 | 4 | PIZ | 0.2 | 12.5 | ⊚ |
| Example 6 | CS | 300 | 4 | PIZ | 0.5 | 13.2 | ⊚ |
| Example 7 | CS | 300 | 4 | PIZ | 1.0 | 14.1 | ⊚ |
| Example 8 | CS | 300 | 4 | MEA | 0.5 | 13.9 | ⊚ |
| Example 9 | CS | 300 | 4 | MEA | 1.0 | 14.8 | ⊚ |
| Example 10 | CS | 300 | 4 | KOH | 0.2 | 14.3 | ○ |
| Example 11 | CS | 550 | 4 | PIZ | 0.2 | 14.3 | ⊚ |
| Example 12 | FS | 150 | 4 | PIZ | 0.2 | 10.8 | ○ |
| Example 13 | FS | 200 | 4 | PIZ | 0.2 | 11.5 | ⊚ |
| Example 14 | PS | 1,700 | 4 | PIZ | 0.2 | 15.0 | ⊚ |
| Comparative Example 1 | CS | 7 | 4 | PIZ | 0.2 | 5.2 | X |
| Comparative Example 2 | CS | 18 | 4 | PIZ | 0.2 | 5.5 | X |
| Comparative Example 3 | CS | 45 | 4 | PIZ | 0.2 | 6.8 | X |

CS: colloidal silica, FS: fumed silica, PS: precipitated silica, PIZ: piperazine hexahydrate, MEA: monoethanolamine, KOH: potassium hydroxide

TABLE 2

Polishing test employing 8-inch silicon wafer P<100> provided with an oxide film

| | Silicon dioxide | Average particle size (nm) | Abrasive concentration (wt %) | Basic compound Type | Basic compound Amount (wt %) | Weight reduction (mg) | Dry gel |
|---|---|---|---|---|---|---|---|
| Example 15 | FS | 70 | 4 | KOH | 0.2 | 4.0 | ○ |
| Example 16 | FS | 150 | 4 | KOH | 0.2 | 5.0 | ⊚ |
| Example 17 | FS | 200 | 4 | — | — | 4.3 | ○ |
| Example 18 | FS | 200 | 2 | KOH | 0.2 | 4.9 | ⊚ |
| Example 19 | FS | 200 | 4 | KOH | 0.1 | 4.8 | ⊚ |
| Example 20 | FS | 200 | 4 | KOH | 0.2 | 5.3 | ⊚ |
| Example 21 | FS | 200 | 4 | KOH | 2.0 | 5.8 | ⊚ |
| Example 22 | FS | 200 | 4 | KOH | 0.2 | 5.3 | ⊚ |
| Example 23 | FS | 200 | 4 | KC | 0.2 | 5.1 | ⊚ |
| Example 24 | FS | 200 | 4 | KHC | 0.2 | 5.0 | ⊚ |
| Example 25 | FS | 200 | 4 | KHC | 0.2 | 5.0 | ⊚ |
| Example 26 | CS | 200 | 4 | KOH | 0.2 | 5.3 | ⊚ |
| Example 27 | PS | 1,700 | 4 | KOH | 0.2 | 6.9 | ⊚ |
| Comparative Example 4 | FS | 30 | 4 | KOH | 0.2 | 2.0 | X |
| Comparative Example 5 | FS | 50 | 4 | KOH | 0.2 | 2.3 | X |
| Comparative Example 6 | CS | 45 | 4 | KOH | 0.2 | 2.0 | X |

CS: colloidal silica, FS: fumed silica, PS: precipitated silica, KOH: potassium hydroxide, KC: potassium carbonate, KHC: potassium hydrogencarbonate From the results shown in Tables 1 and 2, it is evident that the edge polishing composition of the present invention has high polishing removal rates and less deposition of a dry gel on the wafer surface, as compared with conventional edge polishing compositions.

As described in the foregoing, the edge polishing composition of the present invention presents a high polishing removal rate in edge polishing of a silicon wafer or a semiconductor wafer provided with an oxide film and is capable of reducing deposition of a dry gel on the wafer surface.

What is claimed is:

1. A method of polishing the edge surface of silicon wafers or oxide film-coated semiconductor wafers with an edge polishing composition comprising water and silicon dioxide having an average particle size from 70 to 2,500 nm, wherein the silicon dioxide is selected from the group consisting of colloidal silica, fumed silica and precipitated silica.

2. The method according to claim 1, which further contains a basic compound.

3. The method according to claim 1, wherein the basic compound is at least one compound selected from the group consisting of methylamine, dimethylamine, trimethylamine, ethylamine, diethylamine, triethylamine, ethylenediamine, hexamethylenediamine, piperazine hexahydrate, anhydrous piperazine, 1-(2-aminoethyl)piperazine, N-methylpiperazine, diethylenetriamine, monoethanolamine, diethanolamine, triethanolamine, N-methylethanolamine, N-methyl-N,N-diethanolamine, N,N-dimethylethanolamine, N,N-diethylethanolamine, N,N-dibutylethanolamine, N-(β-aminoethyl)ethanolamine, monoisopropanolamine, diisopropanolamine, triisopropanolamine, ammonium hydroxide, tetramethylammonium hydroxide, ammonium carbonate, ammonium hydrogencarbonate, potassium hydroxide and sodium hydroxide.

4. The method according to claim 1, wherein the content of the silicon dioxide is from 0.005 to 50 wt %, based on the total weight of the edge polishing composition.

5. The method according to claim 1, wherein the content of the basic compound is from 0.001 to 30 wt %, based on the total weight of the edge polishing composition.

* * * * *